(12) United States Patent
Nozawa

(10) Patent No.: US 8,588,540 B2
(45) Date of Patent: Nov. 19, 2013

(54) ARITHMETIC ENCODING APPARATUS EXECUTING NORMALIZATION AND CONTROL METHOD

(75) Inventor: Shingo Nozawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 517 days.

(21) Appl. No.: 12/440,867

(22) PCT Filed: Oct. 30, 2007

(86) PCT No.: PCT/JP2007/071442
§ 371 (c)(1),
(2), (4) Date: Mar. 11, 2009

(87) PCT Pub. No.: WO2008/054005
PCT Pub. Date: May 8, 2008

(65) Prior Publication Data
US 2010/0054328 A1      Mar. 4, 2010

(30) Foreign Application Priority Data
Nov. 1, 2006    (JP) .................................. 2006-298214

(51) Int. Cl.
H03M 7/26 (2006.01)
H03M 7/12 (2006.01)
H04N 7/30 (2006.01)
H03M 7/30 (2006.01)

(52) U.S. Cl.
USPC ............. 382/247; 382/237; 382/239; 341/50; 341/106; 341/107

(58) Field of Classification Search
USPC ............. 382/237, 239, 247; 341/50, 106, 107
See application file for complete search history.

(56) References Cited

U.S. PATENT DOCUMENTS 4,905,297 A  *  2/1990  Langdon et al. ............... 382/247
5,297,220 A  *  3/1994  Nomizu ......................... 382/247
(Continued)

FOREIGN PATENT DOCUMENTS

| JP | 2004-135251 A | 4/2004 |
| JP | 2005-525018 A | 8/2005 |
| JP | 2005-252374 A | 9/2005 |

OTHER PUBLICATIONS

W.B. Pennebaker, J.L. Mitchell, G.G. Langdon Jr., & R.B. Arps, "An Overview of the Basic Principles of the Q-Coder Adaptive Binary Arithmetic Coder", 32 IBM J. Res. Develop. 717-726 (Nov. 1988).*

(Continued)

*Primary Examiner* — David Czekaj
*Assistant Examiner* — David N Werner
(74) *Attorney, Agent, or Firm* — Cowan, Liebowitz & Latman, P.C.

(57) ABSTRACT

The number of times of processing to increment the number of reserved bits in arithmetic coding processing is reduced. For this purpose, upon inputting a binary symbol, a zone is divided into two zones at a ratio between occurrence probabilities of MPS and LPS, and one of the divided zones is selected according to the input symbol. When the length of the selected zone is shorter than a predetermined length, normalization is performed. Then it is determined whether or not a threshold for determining a decimal place of interest exists within the zone of interest. When the threshold exists within the zone of interest, the number of reserved bits is incremented by one. When the threshold exists without the zone, 1-bit data determined based on a relative position between the zone of interest and the threshold is outputted, bit data corresponding to the number of reserved bits is determined and outputted, and the number of reserved bits is cleared to zero.

8 Claims, 9 Drawing Sheets

(56) References Cited

U.S. PATENT DOCUMENTS

| | | | |
|---|---|---|---|
| 5,311,177 A * | 5/1994 | Kimura et al. | 341/51 |
| 5,859,604 A * | 1/1999 | Slattery et al. | 341/107 |
| 6,677,869 B2 * | 1/2004 | Horie | 341/107 |
| 6,756,921 B2 * | 6/2004 | Kimura et al. | 341/50 |
| 6,943,710 B2 | 9/2005 | Marpe et al. | |
| 6,950,558 B2 * | 9/2005 | Schwartz et al. | 382/240 |
| 7,176,815 B1 * | 2/2007 | Hung et al. | 341/107 |
| 7,209,593 B2 * | 4/2007 | Kimura et al. | 382/247 |
| 7,221,296 B2 * | 5/2007 | Ziauddin et al. | 341/107 |
| 2002/0030614 A1 * | 3/2002 | Kimura et al. | 341/107 |
| 2005/0249289 A1 | 11/2005 | Yagasaki et al. | |
| 2006/0017591 A1 * | 1/2006 | Bossen | 341/50 |

OTHER PUBLICATIONS

R.R. Osorio & J.D. Bruguera, "A New Architecture for fast Arithmetic Coding in H.264 Advanced Video Coder", Proc. of 2005 Euromicro Conference on Digital System Design (DSD'05) 298-305 (Aug. 2005).*

A. Said, Introduction to Arithmetic Coding—Theory and Practice, HP Laboratories, Apr. 21, 2004.*

Y. Jia, E H Yang, D.K. He, & S. Chan, "A Greedy Renormalization Moethod for Arithmetic Coding", 55 IEEE Trans. on Communications 1494-1502 (Aug. 2007).*

D. Marpe, G. Marten, & H.L. Cycon, "A Fast Renormalization Technique for H.264 / MPEG4-AVC Arithmetic Coding", 51st Internationales Wissenschaftliches Klloquium (Sep. 2006).*

International Organisation for Standardisation Organisation Internationale de Normalisation ISO/IEC JTC1/SC29/ WG11 Coding of Moving Pictures and Audio, Gary Sullivan et al. Jul. 2001 (XP 030036619). "Technical Description of ITU-T VCEG Draft H.26L Algorithm in Response to Video and Dcinema CfPs" M7512, pp. 1-46.

Arithmetic Coding for Data Compression, The State of the Art in Data Compression is Arithmetic Coding, not the better-known Huffman method. Arithmetic Coding gives greater compression, is faster for adaptive models, and clearly separates the model from the channel encoding. XP 000615171, p. 520-540, ISSN: 0001-08782, Ian H. Witten et al.; (Jun. 1, 1987).

A New Architecture for fast Arithmetic Coding in H.264 Advanced Video Coder, Roberto R. Osorio and Javier D. Bruguera University of Santiago de Compostela Dept. Electronic and Computer Engineering Campus Sur. Santiago de Compostela, 15782. Spain e-mail; (roberto,bruguera)@dec.usc.es, Proceedings of the 2005 8th Euromicro Conference on Digital System Design (DSD'05, IEEE (XP 010864760), pp. 298-305, ISBN: 798-07695-2433-7; (Aug. 30, 2005).

* cited by examiner (PRIOR ART)

US 8,588,540 B2

ARITHMETIC ENCODING APPARATUS EXECUTING NORMALIZATION AND CONTROL METHOD

CROSS-REFERENCE TO RELATED APPLICATIONS

This application is a national stage application of International Application No. PCT/JP2007/071442, filed Oct. 30. 2007, whose benefit is claimed and which claims the benefit of Japanese Patent Application No. 2006-298214, filed Nov. 11, 2006, whose benefit is also claimed.

TECHNICAL FIELD

The present invention relates to a technique of performing arithmetic coding of a binary symbol stream generated from digital information such as image data.

BACKGROUND ART

In recent years, in accordance with the advance of digital signal processing technology, a large amount of digital information such as moving images, still images and audio information can be encoded with high efficiency, and can be recorded on a small recording medium or transmitted via a communication medium. A video encoding apparatus is developed utilizing this technique for converting TV-broadcasted video images or video images obtained with a video camera into stream data. Among the moving image coding methods, ITU-T H.264 standard (MPEG 4 part 10/AVC) has attracted particular attention. Entropy coding is the main technique behind many recent high-efficiency compression encoding and arithmetic coding is known as a particularly highly-efficient entropy coding. Arithmetic coding is adopted in the aforementioned H.264 standard.

In the H.264 standard, arithmetic coding known as Context-based Adaptive Binary Arithmetic Coding (hereinbelow, abbreviated to "CABAC") and variable-length coding known as Context-based Adaptive Variable length coding (hereinbelow, abbreviated to "CAVLC") are employed.

As a related art, Japanese Patent Laid-Open No. 2004-135251 proposes a technique focused on the abovementioned CABAC and CAVLC. The application discloses "image information coding method and image information decoding method" of limiting the amount of input/output data to CABAC thereby ensuring processing time in a decoder.

FIG. 5 is a flowchart showing a processing procedure of a conventional arithmetic coding method.

Note that this processing procedure is defined with the ITU-T H.264 standard and is publicly known. The H.264 arithmetic coding, i,e, CABAC coding, handles input of a binary symbol.

In FIG. 5, at step S900, it is determined whether or not the input of a symbol has been completed. When it is determined that the input has not been completed (No at step S900), a symbol is inputted at step S901. The input symbol is "0" or "1", a binary symbol. Next, at step S902, zone dividing is performed. The zone means an area of integers from "0" to "1023" represented with a lower limit and a length. The zone dividing refers to dividing a zone into two zones at a ratio between occurrence probabilities of the binary symbols. For example, when the occurrence probability of symbol "0" is 75% and that of symbol "1" is 25%, the zone is divided at a ratio of 75 to 25 (in this case, the symbol "0" is referred to as an "MPS (More Probable Symbol)", the symbol "1", as an "LPS (Less Probable Symbol)". Next, at step S903, one of the divided zones is selected in accordance with the input symbol.

FIG. 6 shows an example where the current zone is represented with a lower limit value "21" and a length "320". The occurrence probabilities of the symbols 0 and 1 are 75% and 25%. When an input symbol is "1", the "1" zone is selected. As a result, the new lower limit is "261" and the length is "80".

Next, at step S904, it is determined whether or not the length of the new zone is less than "256". When the length of the zone is greater than or equal to "256" (NO at step S904), the process returns to step S900. Further, as in the case of FIG. 6, when the length of the zone is "80" and is less than "256" (YES at step S904), the process branches to step S905.

At step S905, it is determined whether or not the value of the lower limit of the zone is less than "256". When the lower limit of the zone is less than "256" (YES at step S905), the process branches to step S906, at which "0" is outputted as a code stream. At step S907, "1" is outputted in correspondence with the number of reserved bits to be described later, as a code stream. Further, the number of reserved bits is reset to zero. At step S908, the zone is normalized. The normalization is processing to expand the length of a zone less than "256" and ensure precision in the subsequent processing. At step S908, the value of the lower limit and the length of the zone are doubled.

At step S905, when it is determined that the lower limit is greater than or equal to "256" (NO at step S905), the process branches to step S909, at which it is determined whether or not the lower limit of the zone is less than "512". If it is determined that the lower limit of the zone is less than "512" (YES at step S909), the process branches to step S910. If it is determined that the lower limit of the zone is greater than or equal to "512" (NO at step S909), the process branches to step S912.

At step S912, "1" is outputted as a code stream, and at step S913, "0" is outputted in correspondence with the number of reserved bits to be described later, as a code stream. The number of reserved bits is reset to zero. At step S914, the zone is normalized. In the normalization at this step, a value, obtained by subtracting "512" from the value of the lower limit and doubling the subtraction result, is set as a new value of the lower limit. Further, the length of the zone is doubled.

Further, at step S909, when it is determined that the value of the lower limit is less than "512", the process branches to step S910, at which the number of reserved bits is incremented by one. Next, at step S911, the zone is normalized. In the normalization at step S911, "256" is subtracted from the value of the lower limit, then the subtraction result is doubled, and the length of the zone is doubled. In the example of FIG. 6, the value of the lower limit becomes "10" (=(261−256)×2), and the length of the zone becomes "160" (=80×2). Further, the number of reserved bits is incremented to "1". After these normalization processing steps, the process returns to step S904, to repeat the normalization processing until the length of the zone becomes greater than or equal to "256".

For example, in FIG. 6, as the length of the normalized zone is "160", the process proceeds from step S904 to step S905 again. As the value of the lower limit is "10", the process proceeds to step S906. At step S906, "0" is outputted, and as the number of reserved bits has been incremented to "1", one "1" is outputted (step S907). That is, a code stream "01" is outputted. Further, by the normalization processing at step S908, the value of the lower limit is doubled to "20" and the length of the zone is doubled to "320". As the length of the zone is greater than "256", the process returns from step S904 to step S900. The above processing is repeated until the completion of input is detected at step S900 and the process branches to termination processing at step S915.

In the consideration of the inventor, the above-described conventional arithmetic coding has two problems. The first problem is the large number of steps to process one input symbol in the loop from step S904 to step S914, which may increase software processing time or increase the hardware circuit scale. The second problem is the increase in memory capacity for holding values in repetition of increment of the number of reserved bits at step S910, and by extension, the increase in the amount of processing time at steps S907 and S913 as reserved bit resolving processing.

DISCLOSURE OF INVENTION

The present invention has been made in view of the above problems, and provides a technique of, upon application of the arithmetic coding to hardware, realizing simplification of the circuitry and reduction of power consumption, and upon application of the arithmetic coding to software, reduction of memory consumption and high speed processing in accordance with simplification of processing.

To solve the above problems, according to one aspect of the present invention, provided is a coding apparatus, using arithmetic coding, which sequentially inputs a binary symbol to be encoded, generates binary data indicating a value of decimal place greater than or equal to "0" and less than "1" as coded data, and outputs the coded data, comprising: a zone dividing and selection unit to, upon each input of a binary symbol, repeat dividing of a zone represented with finite precision into two zones in accordance with a ratio between occurrence probabilities of MPS (More Probable Symbol) and LPS (Less Probable Symbol) and selection of one of the two zones; a normalization unit to, when a length of the zone selected by the zone dividing and selection unit is less than a predetermined zone length, perform normalization so as to increase the size of the selected zone; and a processing unit to, upon normalization by the normalization unit, determine coded bit data and output the coded bit data, or increment the number of reserved bits to be outputted, in accordance with values of an upper limit and a lower limit of the zone to be normalized.

Further, according to another aspect of the present invention, provided is a coding apparatus, using arithmetic coding, which sequentially inputs a binary symbol to be encoded, generates binary data indicating a value of a decimal place greater than or equal to "0" and less than "1" as coded data, and outputs the coded data, comprising: a zone dividing and selection unit to, upon each input of a binary symbol, repeat dividing of a zone represented with finite precision into two zones in accordance with a ratio between occurrence probabilities of MPS (More Probable Symbol) and LPS (Less Probable Symbol) and selection of one of the two zones; a normalization times determination unit to determine the number of times of normalizations to expand a length of the zone selected by the zone dividing and selection unit based on the length of the zone; a calculation unit to calculate the number of output bits to be outputted as coded data based on the zone selected by the zone dividing and selection unit; a coded data output unit to, when the number of output bits calculated by the calculation unit is greater than "0", generate and output coded data for the number of output bits based on a value of an upper limit or a lower limit of the zone selected by the zone dividing and selection unit, and when the number of reserved bits is not "0", output bit data corresponding to the number of reserved bits, further, to clear the number of reserved bits to zero; a reserved bit update unit to add a result of subtraction of a value indicated with the number of output bits calculated by the calculation unit from a value indicating the number of times of normalizations by the normalization times determination unit, to the number of reserved bits; and a normalization unit to perform normalization on the zone by the number of times of normalizations determined by the normalization times determination unit.

According to the one aspect of the present invention, as the number of process steps to increment the number of reserved bits is smaller than that in the conventional technique. Accordingly, upon application of the arithmetic coding to hardware, the circuitry can be simplified and the power consumption can be reduced.

Further, upon application of the arithmetic coding to software, the memory consumption can be reduced and high speed processing can be performed in accordance with simplification of processing.

Further, according to the other aspect of the present invention, the above advantages can be further improved.

Further features of the present invention will become apparent from the following description of exemplary embodiments with reference to the attached drawings.

BRIEF DESCRIPTION OF DRAWINGS

The accompanying drawings, which are incorporated in and constitute a part of the specification, illustrate the embodiments of the invention and, together with the description, server to explain the principles of the invention.

BEST MODE FOR CARRYING OUT THE INVENTION

Hereinbelow, embodiments of the present invention will be described based on the attached drawings.

<First Embodiment>

Figure 7:
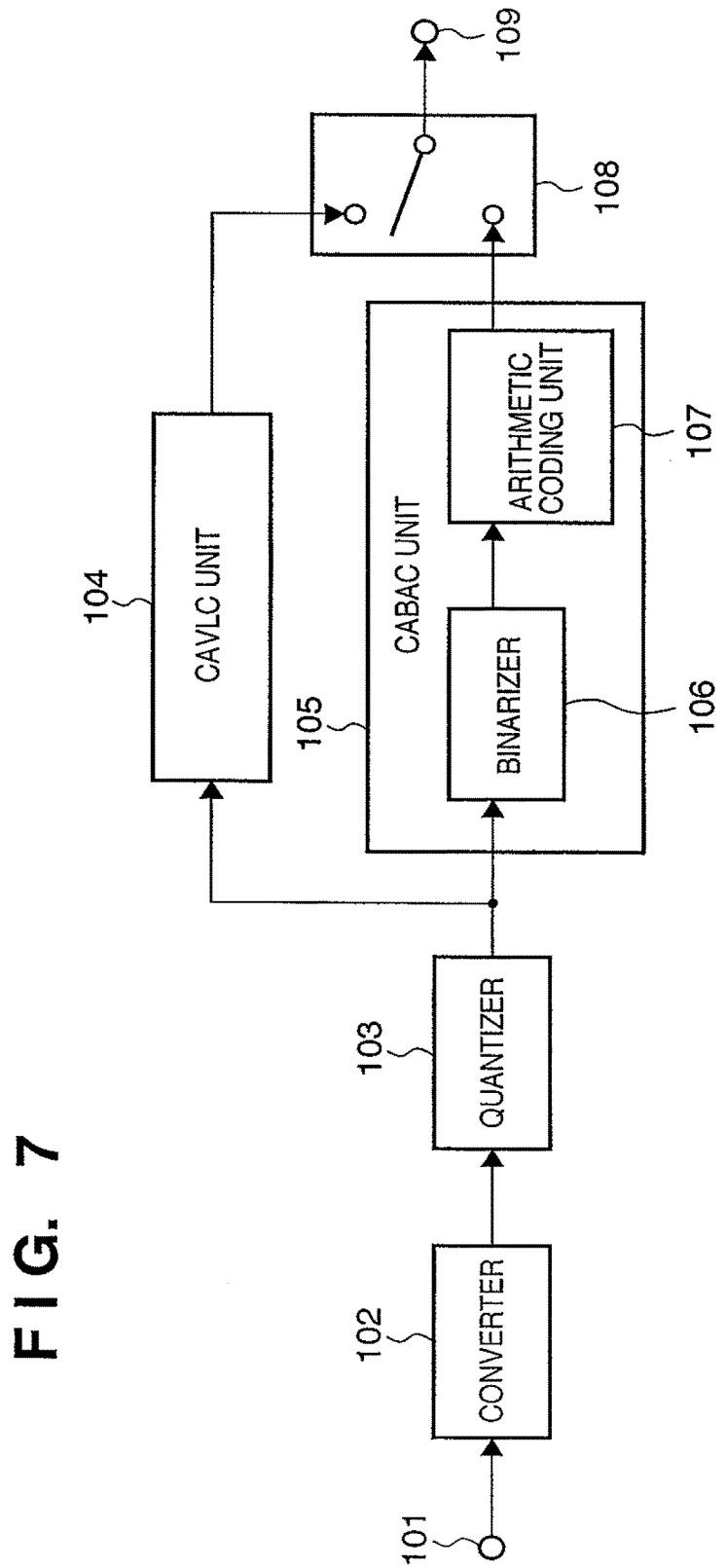
FIG. 7 is a block diagram of an encoder in an apparatus to which the embodiment is applied.

FIG. 7 is a block diagram showing a configuration of an encoder to which the first embodiment of the present invention is applied. Reference numeral 101 denotes a video input unit; 102, a converter; 103, a quantizer; 104, a CAVLC unit; 105, a CABAC unit; 106, a binarizer; 107, an arithmetic coding unit; 108, a selector; and 109, a stream output unit. The encoder according to the present embodiment performs high-efficiency coding processing in accordance with the following procedure based on the H.264 standard. Note that the encoder is applicable to an image sensing apparatus (video camera) or a video image recording/reproducing apparatus.

A digital video signal inputted from the video input unit 101 is supplied to the converter 102. The converter 102 divides image data represented by the input digital video signal into, e.g., 16×16 pixel blocks, and converts each block into a coefficient stream. The converter 102 reduces the amount of redundant visual information in each block by performing motion prediction processing, motion compensation processing and orthogonal transformation processing (frequency conversion) and the like.

The coefficient stream obtained by the conversion processing in the converter 102 is supplied to the quantizer 103. The quantizer 103 quantizes the input coefficient stream in accordance with a previously-set quantization parameter.

In the quantizer 103, the information volume of the coefficient stream is reduced in correspondence with the size of the quantization parameter. The quantized coefficient stream is supplied to the CAVLC unit 104 and the CABAC unit 105. As the CAVLC unit 104 is not directly related to the present invention, a detailed explanation of the CAVLC unit 104 will be omitted; the CABAC unit 105 will now be described.

In the CABAC unit 105, the binarizer 106 converts the input coefficient stream to a binary symbol stream including symbols "0" and "1".

The arithmetic coding unit 107 sequentially inputs the binary symbol stream binarized by the binarizer 106, performs processing in accordance with the following procedure, thereby generates a compressed arithmetic coded data stream and outputs the data stream. At this time, as the binarizer 106 can one-to-one convert each coefficient to a binary symbol stream using a table, the processing can be performed by one coefficient. Moreover, the arithmetic coding unit 107 performs processing on each binary symbol.

The code stream generated by the CAVLC unit 104 and the code stream generated by arithmetic coding in the CABAC unit 105 are respectively supplied to the selector 108, and one of the code streams is selected as an output by the selector 108. The selected stream is then outputted from the stream output unit 109.

The characteristic feature of the present embodiment resides in the arithmetic coding unit 107 in FIG. 7. Next, the arithmetic coding unit 107 will be described in more detail.

As described above, the arithmetic coding is repeating zone dividing and zone selection in correspondence with the value of input symbol, to obtain a value greater than or equal to "0" and less than "1" after the decimal point as an encoded result. As a value greater than or equal to "0" and less than "1" after the decimal point is represented as "0.xxx ... (where x takes the binary value 0 or 1)", the "xxx ..." portion excluding integer and decimal point is obtained as encoded data. The bit in the first decimal place indicates a decimal number "0.5", and the bit in the second decimal place, "0.25". That is, a value represented with a bit in the i-th decimal place is ½ the value represented with a bit in the (i−1)th decimal place. For example, a decimal number "0.75" is represented as "0.11" in binary notation.

Further, as the arithmetic coding is performed by using an electronic circuit or a computer program, the lower limit, the upper limit and the length of one zone are represented with registers with a limited number of bits. However, when the respective bits after the decimal point are obtained, the length of the zone is gradually narrowed. That is, the difference between the registers defining the lower limit and the upper limit of the zone gradually becomes small, and the precision upon dividing the zone at a ratio between occurrence probabilities of the symbols is gradually lowered. Accordingly, to effectively use the number of bits, processing to expand the length of the zone is required when the length becomes less than a predetermined threshold value. The processing to expand the length of zone is known as normalization.

Figure 1:
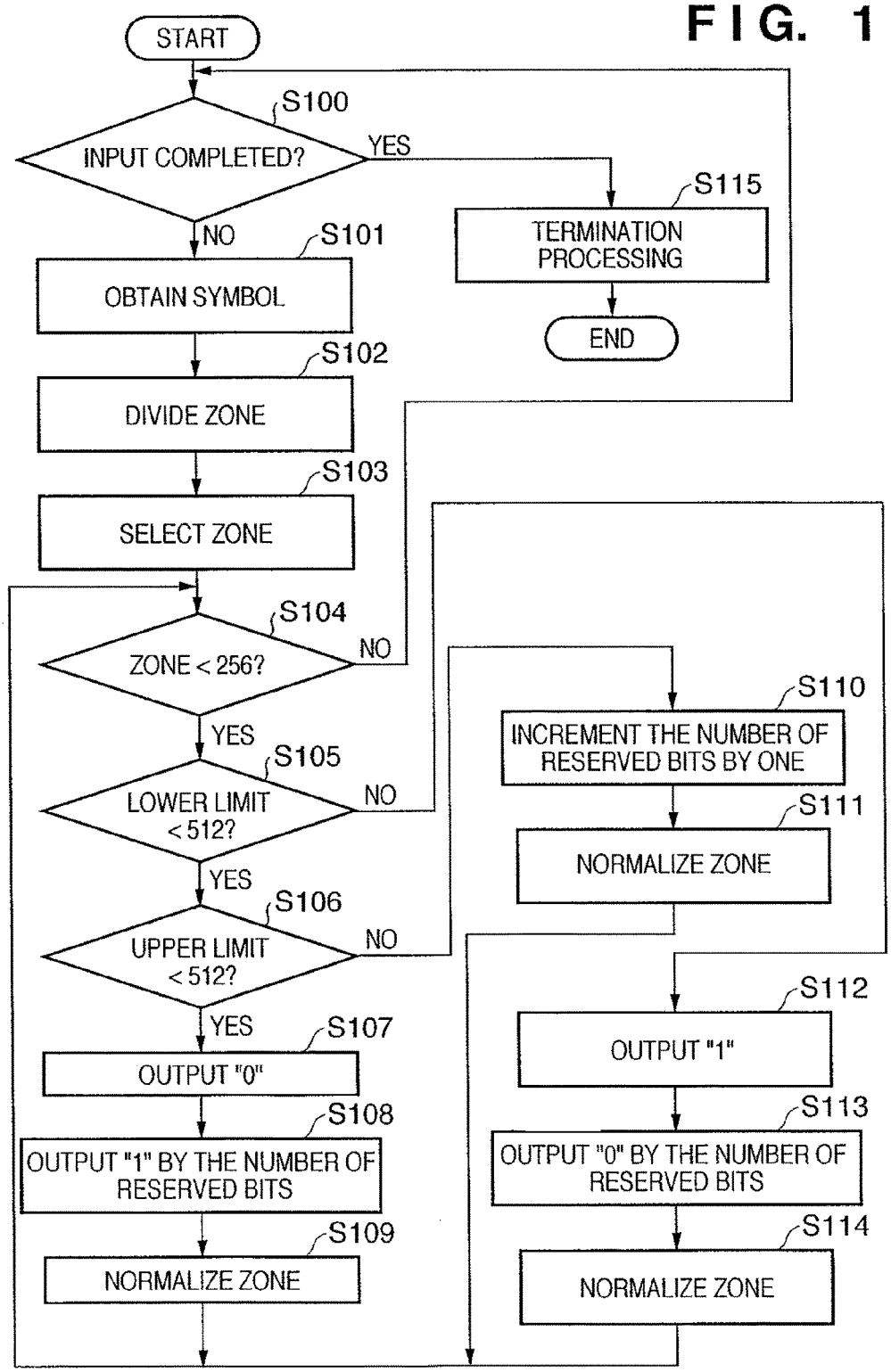
FIG. 1 is a flowchart showing a processing procedure in an arithmetic coding unit according to a first embodiment of the present invention.

FIG. 1 is a flowchart showing a processing procedure of the arithmetic coding processing in the arithmetic coding unit 107 according to the present embodiment. Hereinbelow, the content of processing in the arithmetic coding unit 107 will be described in accordance with the flowchart.

First, at step S100, it is determined whether or not input of symbols to be encoded has been completed. The determination may be made by counting the number of input symbols and determining whether or not the counted number has reached a predetermined number of symbols as a coding unit.

When input is complete, i.e, when it is determined that the coding processing has been completed (YES at step S100), the process proceeds to step S115.

On the other hand, if input is has not been completed, i.e., when it is determined that the coding processing has not been completed (NO at step S100), the process proceeds to step S101.

At step S101, one symbol is obtained. In the present embodiment, the symbol to be encoded is a "0" or "1" binary symbol outputted from the binarizer 106.

Next, at step S102, the zone is divided. At the start of coding, the zone ranges from "0" to "1023". That is, the lower limit is "0" and the length of the zone is "1024". The zone is defined with the lower limit "0", the upper limit value "1023" as an integer "1", and the value between the lower limit and the upper limit representing a value after the decimal point. In this case, the value of the lower limit and that of the upper limit are each respectively held in 10-bit registers.

The dividing of the zone at step S102 is a division into two zones at a ratio between occurrence probabilities of input binary symbols. For example, when the occurrence probability of "0" is 75% and that of "1" is 25%, the zone is divided at a ratio of 75 to 25.

Next, at step S103, one of the divided zones is selected in accordance with the input symbol. For example, in FIG. 6, the value of the lower limit of the current zone is "21", the length of the zone is "320", the occurrence probabilities of "0" symbols and "1" symbols are 75% and 25%. When the input symbol is "1", the "1" zone is selected. The value of the new lower limit is "261", and the length of the zone is "80".

Next, at step S104, the new zone length is compared with the threshold value "256". When the length of the zone is greater than or equal to "256" (NO at step S104), the process returns to step S100.

Figure 6:
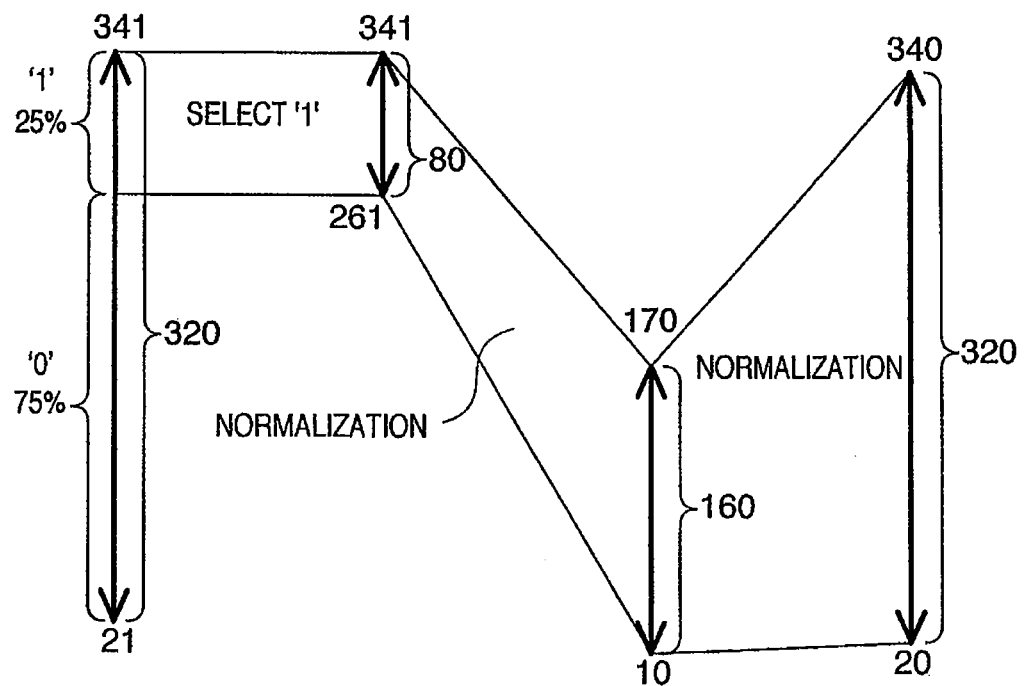
FIG. 6 is an explanatory view of normalization processing.

Further, as shown in FIG. 6, when the length of the zone is "80" and is less than "256" (YES at step S104), the process branches to step S105.

At step S105, the value of the lower limit of the zone is determined. When the value of the lower limit is less than "512" (YES at step S105), the process branches to step S106. At step S106, it is determined whether or not the value of the upper limit of the zone is less than "512".

When it is determined at step S106 that the value of the upper limit is less than "512" (YES at step S106), the process proceeds to step S107.

The process proceeds to step S107 when the value of the upper limit and the lower limit of the selected zone are both equal to or less than "512". Accordingly, at step S107, "0" is outputted as a bit after coding. Then, at step S108, "1" is outputted in correspondence with a value indicated with the number of reserved bits at this time, then the number of reserved bits is reset to "0". Note that immediately after the process has proceeded to step S108, when the number of reserved bits is "0", resetting is not performed.

At step S109, the zone is normalized. The normalization processing at step S109 is to expand the zone less than "256" so as to ensure precision in the subsequent coding processing. At step S109, a value obtained by doubling the value of the lower limit is set as a value of the lower limit of the updated zone. Further, the length of the zone is doubled, and the result is set as the length of the updated zone. The process then returns to step S104.

On the other hand, when it is determined at step S105 that the value of the lower limit of the selected zone is greater than or equal to "512" (NO at step S105), the process branches to step S112. That is, when the values of the upper limit and the lower limit of the current zone are both greater than or equal to "512".

At step S112, as the value of digit of interest, "1" is outputted as a bit after coding. Next, at step S113, "0" is outputted in correspondence with a number indicated by the number of reserved bits, then the number of reserved bits is reset to "0".

Then, at step S114, the zone is normalized. The normalization processing at step S114 expands the zone less than "256" so as to ensure precision in the subsequent coding processing. At step S114, a value obtained by subtracting "512" from the value of the lower limit and doubling the subtraction result, is set as the value of the lower limit of the updated zone. Further, the result of doubling of the length of the zone is set as the length of the updated zone. The process then returns to step S104.

Further, when it is determined at step S106 that the value of the upper limit of the zone is greater than or equal to "512" (NO at step S106), the process proceeds to step S110. The process proceeds to step S110 when the value of the lower limit of the zone is less than "512" and the value of the upper limit of the zone is greater than or equal to "512".

That is, at this time, whether the bit of the digit of interest is "0" or "1" is unknown. Accordingly, the number of reserved bits is incremented by one at step S110.

Next, at step S111, the zone is normalized. In the normalization at step S111, "256" is subtracted from the value of the lower limit of the zone, the subtraction result is doubled and this value is used to as the lower limit of the updated zone. Further, the result of doubling of the length of the zone is set as the length of the updated zone. Thereafter, the process returns to step S104.

In this manner, when all the symbols to be encoded have been processed from step S100 to step S114, termination processing is performed at step S115. In the termination processing, a convenient between the upper limit and the lower limit determined in the processing just described, in binary notation is determined, and based on the value, a bit of a yet-to-be outputted digit is outputted. For example, assuming that the value of the upper limit of the zone is equal to that of the lower limit (the length of the zone is "0"), a coded bit and a reserved bit at that time are outputted.

The processing by the arithmetic coding unit 107 according to the present embodiment is as described above. In the processing according to the present embodiment, the number of execution times of the step to increment the number of reserved bits can be reduced to the half of that in the conventional method described above in FIG. 5.

For example, in FIG. 6, the value of the lower limit of the new zone obtained by zone selection is "261". In the conventional method, upon branching at steps S905 and S909, the process proceeds to step S910 to increment the number of reserved bits.

On the other hand, according to the present embodiment, as the value of the lower limit of the zone is "261" and the value of the upper limit of the zone is "341" (=261+80), the processing at step S107 and the subsequent steps is performed through the branching at steps S105 and S106. That is, in the above case, the processing to increment the number of reserved bits is not performed.

Further, at step S107, a bit "0" is outputted as coded data. Thereafter, the process proceeds to step S108, however, in FIG. 6, the number of reserved bits is still zero. Accordingly, this step S108 is not performed. Then, the value of the lower limit of the current zone and the length of the zone are respectively doubled in the normalization processing at step S109. That is, the value of the lower limit of the zone becomes "522" and the length of the zone becomes "160". Thereafter, the process returns to step S104. As the length of the zone is "160" and is less than the threshold value "256", the process proceeds, through the branching at steps S104 and S105, to step S112. At step S112, "1" is outputted, and step S113 is not performed. Then as a result of the normalization processing at step S114, the value of the lower limit of the zone becomes "20" (=(522−512)×2), and the length of the zone becomes "320" (=160×2).

Figure 5:
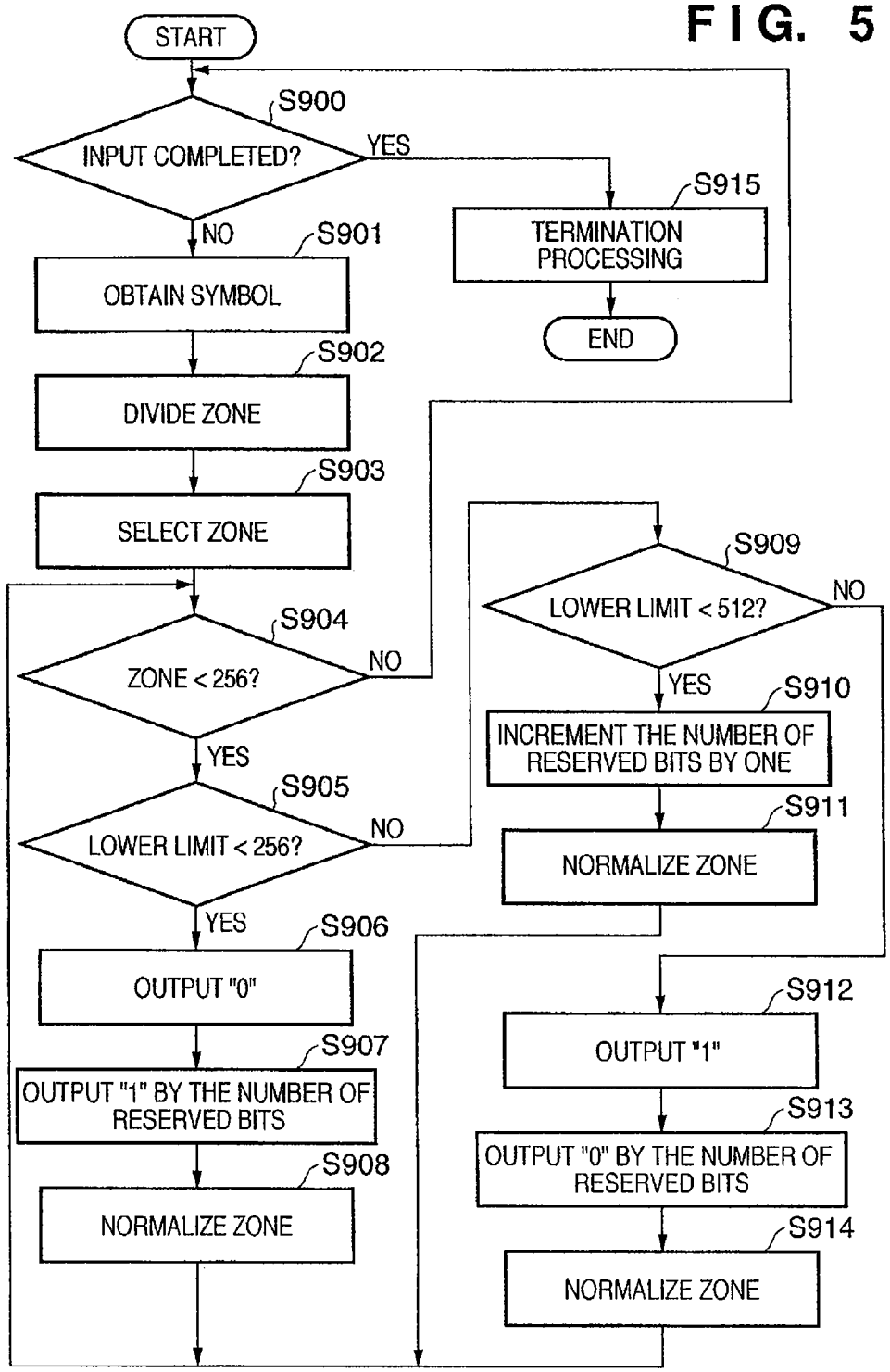
FIG. 5 is a flowchart showing the processing procedure of the conventional arithmetic coding.

Then the outputted coded data is "01", the value of the lower limit of the zone is "20", and the length of the zone is "320". Note that in the present embodiment, although incrementing of the number of reserved bits is not performed, the same output and the same zone size as those in the conventional method shown in FIG. 5 are obtained.

Figure 2:
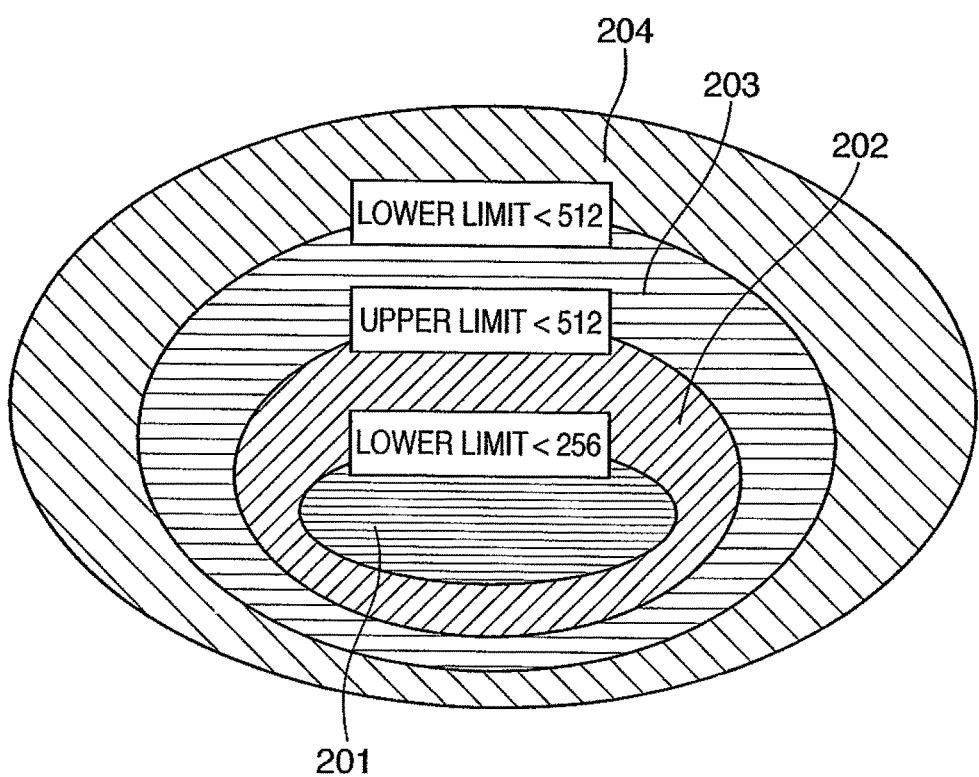
FIG. 2 is a Venn diagram showing the classification of a zone in an arithmetic coding process according to the first embodiment.

Next, the difference between the conventional technique and the processing in the present embodiment will be described using FIG. 2. FIG. 2 is a Venn diagram showing a zone before normalization which is classified with ranges of upper limit and lower limit.

In the conventional method, the length of the zone is less than "256" and a bit "0" is outputted as coded data only in an area 201 where the value of the lower limit of the zone is less than "256". That is, in the remaining areas 202 and 203, the processing to increment the number of reserved bits is performed.

On the other hand, in the present embodiment, when the length of the zone is less than "256" and the conditions of the areas 201 and 202 are satisfied, a bit "0" is outputted as coded data. Only in the area 203 where the value of the upper limit of the zone is greater than or equal to "512" and the value of the lower limit is less than "512", the number of reserved bits is incremented.

In this manner, in the present embodiment, the zone is classified in more detail using the upper limit. As a bit "0" is outputted as coded data when the zone stands in the area 202 where the reservation is not required, the number of times of the increment of the number of reserved bits can be reduced to the half of that in the conventional technique. Accordingly, in the area 204 where the value of the lower limit of the zone is greater than or equal to "512", "1" is outputted as a bit of coded data. Accordingly, the processed result according to the present embodiment in the area 204 where the value of the lower limit of the zone is greater than or equal to "512" corresponds with that of the conventional technique.

Figure 8:
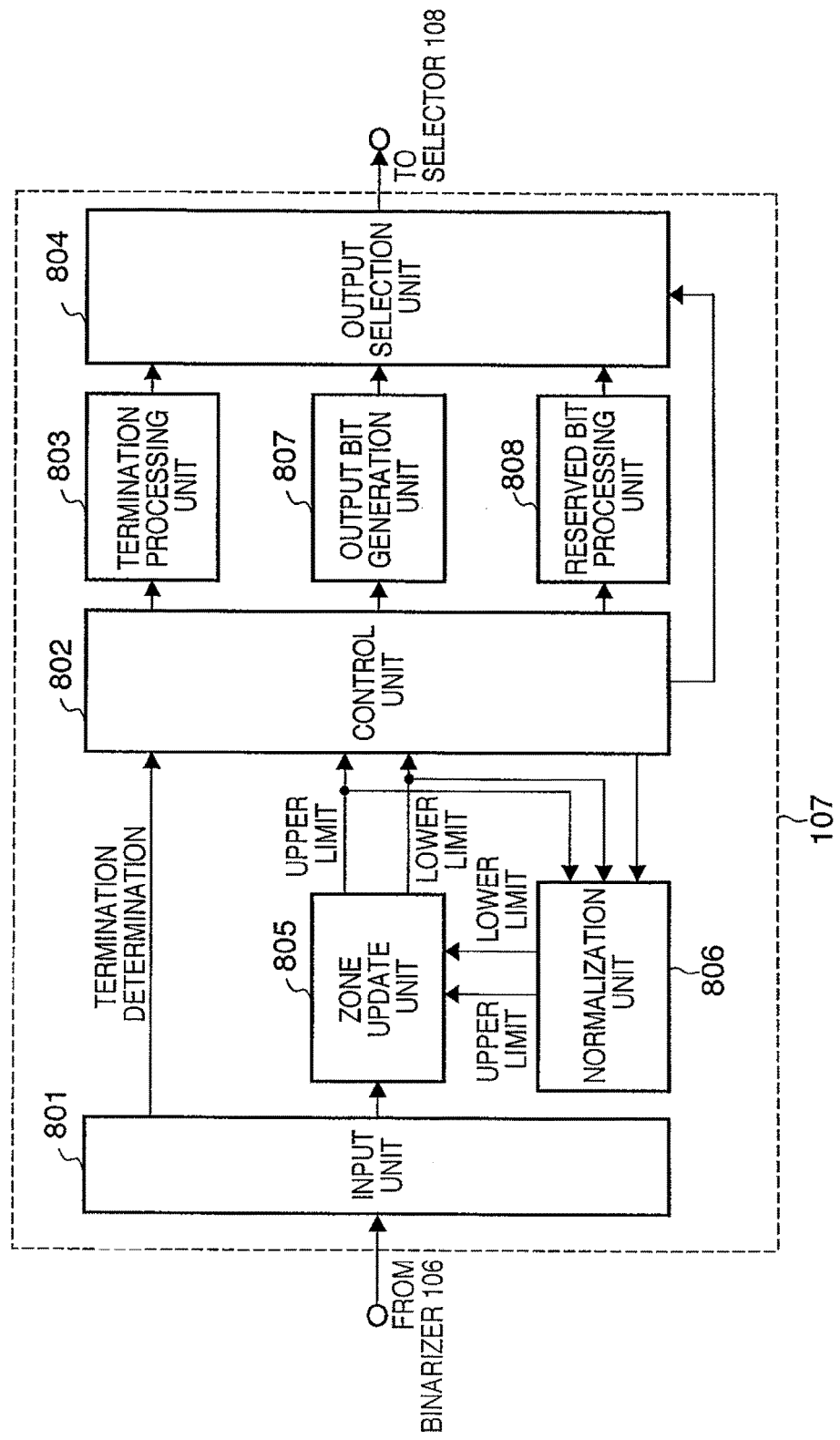
FIG. 8 is a particular block diagram of the arithmetic coding unit according to the first embodiment.

FIG. 8 is a block diagram showing a particular configuration of the arithmetic coding unit 107 according to the present embodiment.

As shown in FIG. 8, the arithmetic coding unit 107 according to the present embodiment has an input unit 801, a control unit 802, a termination processing unit 803, an output zone unit 804, a zone update unit 805, a normalization processing unit 806, an output bit generation unit 807, and a reserved bit processing unit 808. The operation of the arithmetic coding unit 107 having this configuration will be described in correspondence with the flowchart of FIG. 1.

At step S101, the input unit 801 sequentially inputs a binary symbol from the binarizer 106. Further, when it is detected that the number of input symbols has become a predetermined number as the unit of coding, the input unit 801 outputs a termination determination signal to the control unit 802.

The zone update unit 805 performs zone dividing at step S102 and zone selection at step S103, and supplies signals indicating values of the upper limit and the lower limit of the selected zone to the control unit 802 and the normalization processing unit 806.

The control unit 802 supplies control signals based on signals supplied from the respective blocks, to the respective blocks.

The termination processing unit 803 performs the termination processing at step S115 in accordance with a trigger signal from the control unit 802, and supplies a termination bit stream to the output selection unit 804.

The output bit generation unit 807 supplies "0" or "1" to the output selection unit 804 in accordance with a control signal from the control unit 802. This processing corresponds to step S107 or S112 in FIG. 1.

The reserved bit processing unit 808 supplies the reserved bit stream at step S108, S110 or S113 to the output selection unit 804 in accordance with a control signal from the control unit 802.

The output selection unit 804 selects one of the bit streams supplied from the termination processing unit 803, the output bit generation unit 807 and the reserved bit processing unit 808 in accordance with a control signal from the control unit 802, and outputs the selected bit stream.

The normalization processing unit 806 receives a control signal from the control unit 802 and signals indicating the values of the upper limit and the lower limit from the zone update unit 805, normalizes the zone, and supplies values of the upper limit and the lower limit of the new zone to the zone update unit 805. This processing corresponds to steps S109, S111 and S114 in FIG. 1. One of these steps S109, S111 and S114 is performed based on a control signal from the control unit 802. The values of the upper limit and the lower limit changed by the normalization processing are supplied via the zone update unit 805 to the control unit 802.

The control unit 802 generates signals to control the respective blocks in accordance with determination at steps S100, S104, S105 and S106 as branching steps of the flowchart of FIG. 1.

As described above, according to the present embodiment, upon coding of a binary symbol stream, the number of times that the number of reserved bits must be incremented can be reduced to half of that required in the conventional technique. Further, the compatibility of the generated coded data can be assured. Accordingly, an increase in hardware circuit scale can be prevented.

Further, it may be arranged such that an input device (a video camera, an image scanner or a storage device for storing non-compressed image data) to input image data to be encoded is provided, and the other respective constituent elements shown in FIG. 7 are realized with a high-level control unit such as a microcomputer and a RAM holding a program executed by the control unit. Further, it may be arranged such that only the arithmetic coding unit 107 in FIG. 7 is realized with a microcomputer and a software program executed by the microcomputer.

<Second Embodiment>

Figure 3:
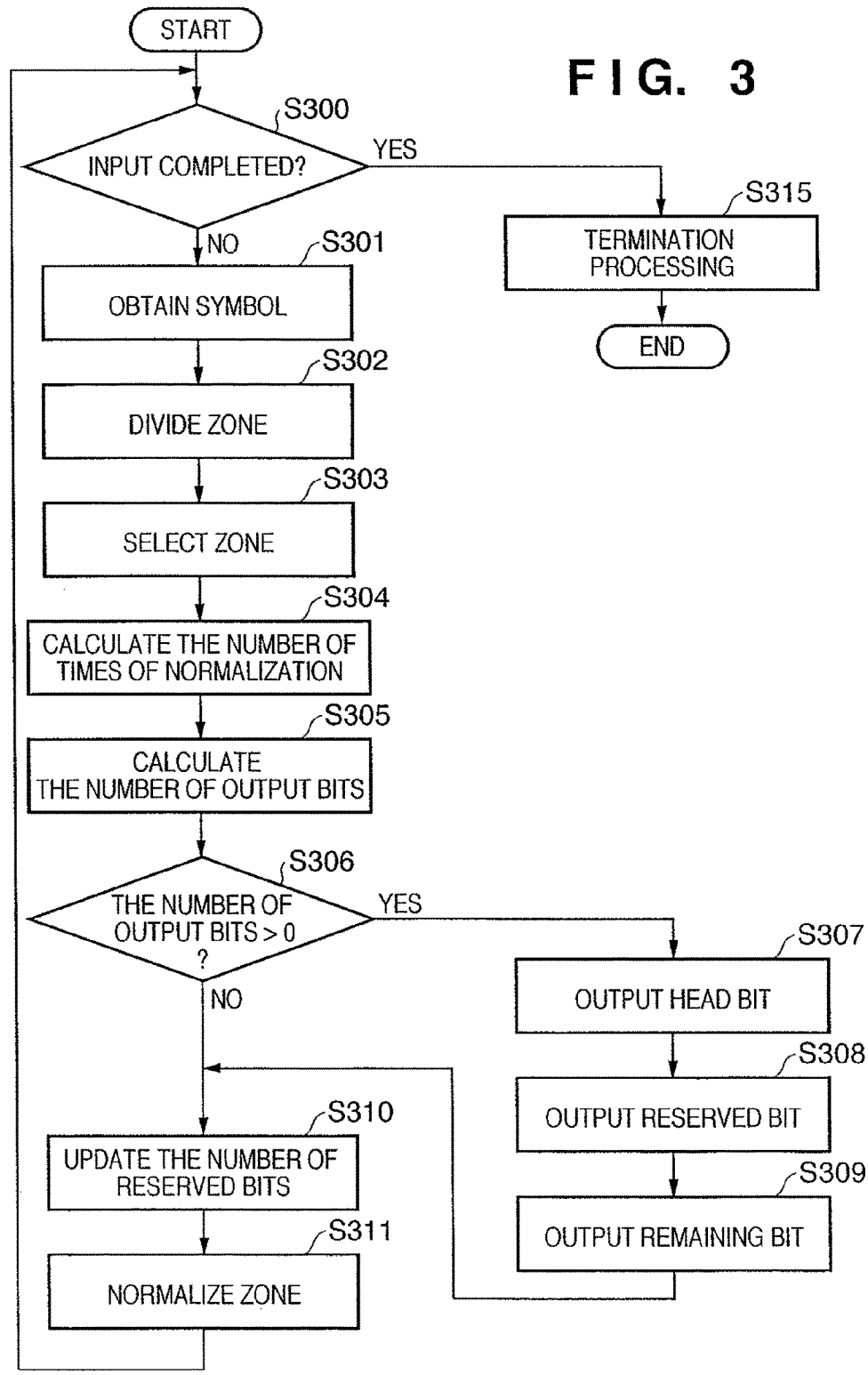
FIG. 3 is a flowchart showing the processing procedure in the arithmetic coding unit according to a second embodiment of the present invention.

Next, a second embodiment of the present invention will be described. FIG. 3 is a flowchart showing the processing procedure in the arithmetic coding unit 107 according to the second embodiment. In the present embodiment, as the constituent elements other than the arithmetic coding unit 107 are identical to those in the first embodiment, explanations of those elements will be omitted.

Hereinbelow, the processing procedure in the arithmetic coding unit 107 will be described in accordance with the flowchart of FIG. 3.

First, at step S300, it is determined whether or not input of symbols to be encoded has been completed. The determination may be made by counting the number of input symbols and determining whether or not the counted number has become a predetermined number of symbols as a coding unit.

When the input has been completed, i.e., when it is determined that the coding processing has been completed (YES at step S300), the process proceeds to step S315.

On the other hand, when the input has not been completed, i.e., when it is determined that the coding processing has not been completed (NO at step S300), the process proceeds to step S301.

At step S301, one symbol is obtained. In the present embodiment, the symbol to be encoded is a "0" or "1" binary symbol outputted from the binarizer 106.

Next, at step S302, the zone is divided. Upon start of coding, the lower limit is "0" and the length of the zone is "1024".

The dividing of the zone at step S302 is a division of the zone into two zones at a ratio between occurrence probabilities of input binary symbols. For example, when the occurrence probability of "0" is 75% and that of "1" is 25%, the zone is divided at a ratio of 75 to 25. Next, at step S303, one of the divided zones is selected in accordance with the input symbol. For example, in FIG. 6, the zone is represented with the lower limit "21" and the length "320" and the occurrence probabilities of symbols "0" and "1" are 75% and 25%. In this case, when the input symbol is "1", the "1" zone is selected. The value of the lower limit of the new zone is "261" and the length is "80".

Next, at step S304, the number of times of normalization processing (i.e, the number of normalization) is calculated based on the length of the zone newly selected at step S303. As described above, normalization processing is performed when the length of the zone is less than "256", to double the length of the zone. Normalization processing is repeated until the length of the zone is greater than or equal to "256".

That is, the relation between the length of the zone and the number of times normalization must be performed is as follows.

When the length of the zone is greater than or equal to "128" and less than "256", the number of normalizations is one.

When the length of the zone is greater than or equal to "64" and less than "128", the number of normalizations is two.

When the length of the zone is greater than or equal to "32" and less than "64", the number of normalizations is three.

When the length of the zone is greater than or equal to "16" and less than "32", the number of normalizations is four.

When the length of the zone is greater than or equal to "8" and less than "16", the number of normalizations is five.

When the length of the zone is greater than or equal to "4" and less than "8", the number of normalizations is six.

When the length of the zone is represented in 9-bit binary notation, the number of normalizations corresponds to a sequence of zeros from the most significant bit (MSB) toward the least significant bit (LSB). Accordingly, at step S304, the number of continuous zeros is counted from the MSB, and the counted value is set as the number of times of normalizations. Note that the acquisition of the number of times of normalizations is not limited to the above method. For example, the base-"2" logarithm of the length of the zone is obtained, and its decimal portion is rounded down. Then the value obtained by subtracting the obtained logarithm from "8" is set as the number of times of normalizations. Note that in the former method, the number of times of normalizations can be obtained with more simple processing or a more simple circuit configuration.

Next, at step S305, the number of code bits to be determined and outputted is calculated. When the processing to increment the number of reserved bits is not performed, the number of times of normalizations and the number of bits to be determined and outputted correspond with each other.

Figure 4:
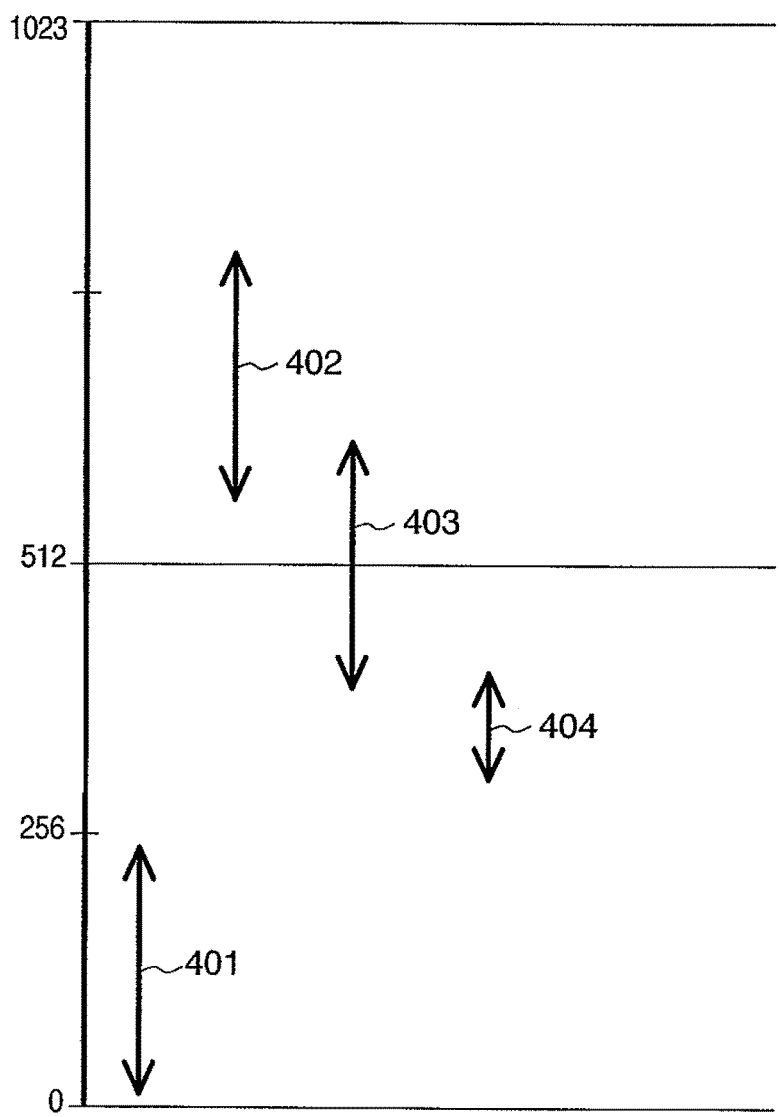
FIG. 4 is a graph showing zones in arithmetic coding according to the second embodiment.

For example, FIG. 4 shows zones 401 to 403 with lengths respectively greater than or equal to "128" and less than "256". Accordingly, the number of times of normalizations for the zones 401 to 403 is one. In the zone 401, as the value of the upper limit is less than "512", "0" is outputted as a bit of coded data. In the zone 402, as the value of the lower limit is greater than or equal to "512", "1" is outputted.

On the other hand, in the zone 403, as the value of the lower limit is less than "512" and the value of the upper limit is greater than or equal to "512", the number of reserved bits is incremented by one but no coded data bit is outputted at this time. That is, in a zone, when the threshold value "512" exists between the upper limit and the lower limit, the number of reserved bits is incremented by one, and no coded data is outputted.

The above arrangement will now be described in more detail.

When the upper limit and the lower limit of a zone are represented with 10 bits, and the values of the upper limit and the lower limit are both less than "512", the most significant bit (MSB) of the upper limit and that of the lower limit are both "0". Further, when the values of the upper limit and the lower limit are both greater than or equal to "512", the MSB of the upper limit and the MSB of the lower limit are both "1". When the zone includes "512" (i.e., when the lower limit <512≤upper limit holds), the MSB of the upper limit and the MSB of the lower limit do not correspond with each other.

Accordingly, when the MSB of the upper limit and the MSB of the lower limit correspond with each other, one output bit is determined. When the MSB of the upper limit and the MSB of the lower limit do not correspond with each other, the number of reserved bits is incremented by one. The above processing is similarly performed in the case of plural times of normalizations.

Returning to FIG. 4, in the zone 404, the value of the lower limit is "270", the value of the upper limit, "389", and the length of the zone, "119" (=389−270).

According to the procedure of the above-described first embodiment, as a result of two normalizations, a 2-bit code "01" is outputted. The number of output bits is two because "512" does not exist between the upper limit and the lower limit after the first normalization, and "512" does not exist between the upper limit and the lower limit doubled after the second normalization. In other words, after the first normalization, when "256" does not exist between the upper limit and the lower limit, then after the second normalization to double the values of the upper limit and the lower limit, "512" does not exist between the upper and the lower limit of the zone. That is, when "512" does not exist between the upper and the lower limit of the zone, the number of output bits is one. Further, when "256" does not exist between the upper and the lower limit of the zone, the number of output bits is two. Further, when "128" does not exist between the upper and the lower limit of the zone, the number of output bits is three. Therefore, When the values of the upper limit and the lower limit of a zone are represented in 10-bit binary notation, the number of corresponding bits from the MSB between the both limits is equal to the number of output bits. Note that as the number of output bits does not exceed the allowable number of times of normalizations, the number of output bits is clipped by the allowable number of times of normalizations as an upper limit.

Returning to FIG. 3, the number of output bits calculated as above is determined. At step S306, it is determined whether or not the number of output bits is greater than or equal to "1". When it is determined that the number of output bits is greater than or equal to "1" (YES at step S306), processing at steps S307 to S309 is performed. When it is determined that the number of output bits is zero (NO at step S306), the process proceeds to step S310.

At steps S307 to S309, a bit stream is outputted as a code. At this time, the output bit stream is the corresponding bit stream between the upper limit and the lower limit of the zone.

For example, in the case of the zone 404 in FIG. 4, the value of the upper limit is "389" and that of the lower limit is "270". These values are represented in binary notation as "0110000101" (upper limit) and "0100001110" (lower limit). Accordingly, as two bits "01" from the MSB are the corresponding bits between the both limits, the corresponding bit stream "01" is outputted.

Next, at step S310, the number of reserved bits is updated. A value obtained by subtracting the number of output bits from the number of times of normalizations is added to the number of reserved bits. Then, at step S311, the zone is normalized. The normalization is repeated removal of the output bit stream (set to zero) from the lower limit and doubling of the value of the lower limit by the number of times of normalizations. Further, the length of the zone is doubled by the number of times of normalizations. Note that doubling by N times is the same as an N-bit left shift calculation.

At the output of the bit stream from step S307 to step S309, when the number of reserved bits is greater than or equal to one, first, at step S307, only the head bit of the output bit stream is outputted. Then at step S308, an inverted bit of the head bit is outputted by the number of reserved bits. Then at step S309, the remaining bit stream is outputted.

For example, in the zone 404 in FIG. 4, when the number of reserved bits is "3", the head bit "0" of the output bit stream "01" is first outputted, then the inverted bit "1" of the bit "0" is outputted by the number of reserved bits, "111". Then, the remaining bit stream "1" (second bit of "01") is outputted at step S309. Accordingly, the outputted coded data is "01111". Note that the number of reserved bits is reset to zero.

Returning to step S300, to repeat the processing at steps S301 to S311 until it is determined that the input of the symbols has been completed. When it is determined that the input of the symbols has been completed, the termination processing at step S315 is performed.

As it is apparent from the flowchart of FIG. 3, as the number of times of normalizations and the number of output bits are calculated and processing is performed all at once, the number of loops is very small in comparison with the conventional method. Further, it is apparent that one input symbol can be processed in one loop.

Figure 9:
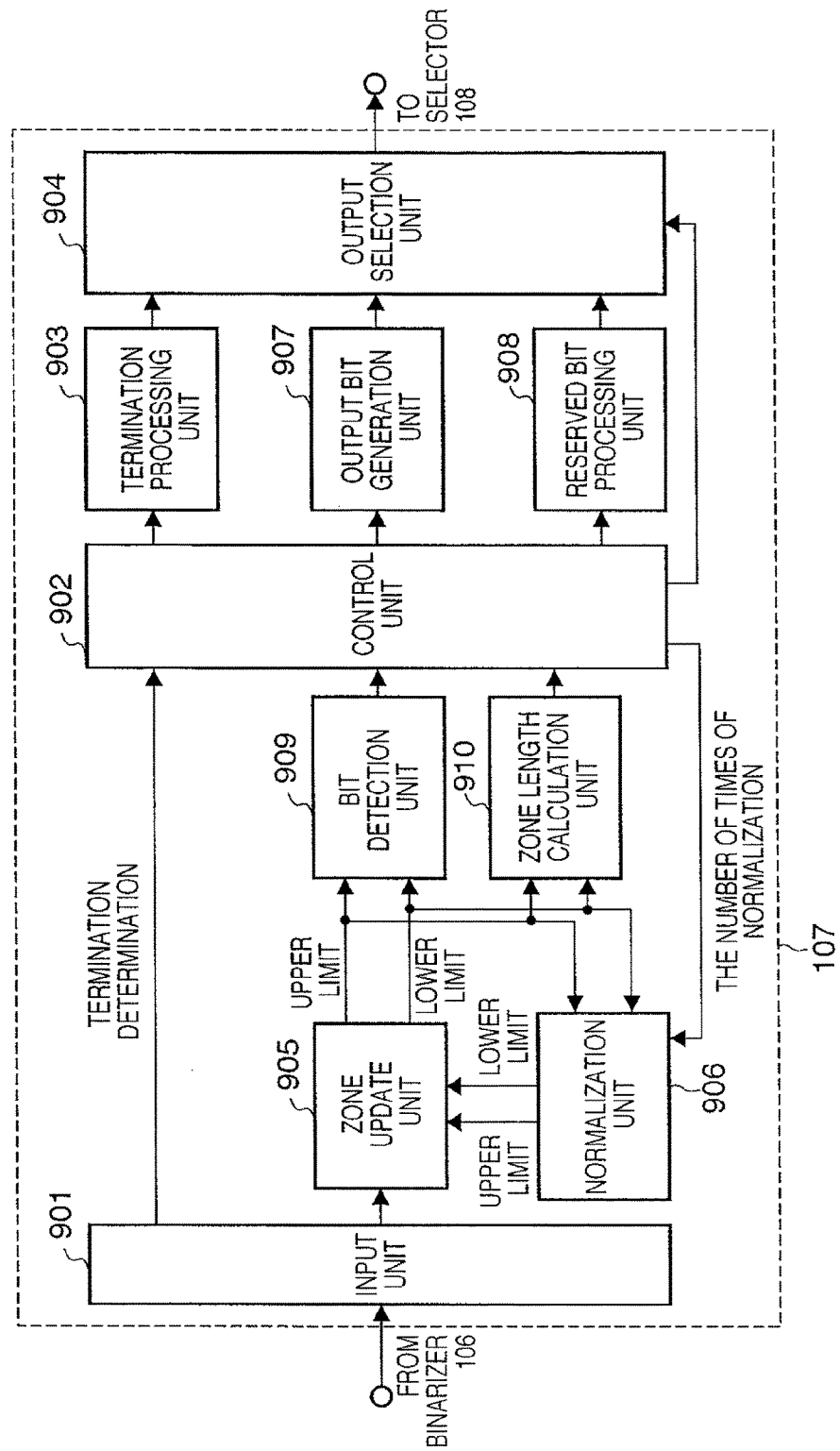
FIG. 9 is a particular block diagram of the arithmetic coding unit according to the second embodiment.

FIG. 9 is a block diagram showing the configuration of the arithmetic coding unit 107 according to the second embodiment to perform the above-described processing. The arithmetic coding unit 107 according to the second embodiment has an input unit 901, a control unit 902, a termination processing unit 903, an output selection unit 904, a zone update unit 905, a normalization unit 906, an output bit generation unit 907, a reserved bit processing unit 908, a corresponding bit detection unit 909, and a zone length calculation unit 910. Hereinbelow, the operations of respective processing units will be described in accordance with the flowchart of FIG. 3.

At step S301, the input unit 901 sequentially inputs a binary symbol from the binarizer 106. Further, when it is detected that the number of input symbols has reached a predetermined number as the unit of coding, the input unit 901 outputs a termination determination signal to the control unit 902.

The zone update unit 905 performs the zone dividing at step S302 and the zone selection at step S303, and supplies signals indicating the values of the upper limit and the lower limit of the selected zone to the corresponding bit detection unit 909, the zone length calculation unit 910 and the normalization unit 906.

The corresponding bit detection unit 909 compares the value of the upper limit supplied from the zone update unit 905 with the value of the lower limit also supplied from the zone update unit 905, and counts the number of corresponding bits continuous from the MSB in binary representation. This processing corresponds to step S305. The number of corresponding bits is supplied to the control unit 902.

The zone length calculation unit 910 subtracts the value of the lower limit supplied from the zone update unit 905 from the value of the upper limit also supplied from the zone update unit 905 thereby obtains the length of the zone (corresponding to the step S304). The zone length calculation unit 910 supplies a signal indicating the length of the zone to the control unit 902.

The control unit 902 calculates a necessary number of times of normalizations from the length of the zone inputted from the zone length calculation unit 910, and supplies the number of times of normalizations to the normalization unit 906.

The normalization unit 906 normalizes the values of the upper limit and the lower limit supplied from the zone update unit 905, in accordance with the number of times of normalizations supplied from the control unit 902, and supplies the values of the new upper and lower limits of the zone to the zone update unit 905. This processing corresponds to step S311. Thus, the normalization by the obtained number of times of normalizations is performed in one step without loop processing.

Further, the control unit 902 supplies control signals based on signals supplied from the respective units, to the respective units.

When the termination determination signal from the input unit 901 is received, the control unit 902 outputs a trigger signal to the termination processing unit 903. The termination processing unit 903 performs the termination processing corresponding to step S115 in accordance with the trigger signal from the control unit 902, and outputs a termination bit stream to the output selection unit 904.

The output bit generation unit 907 supplies "0" or "1" to the output selection unit 904 in accordance with a control signal from the control unit 902. This processing corresponds to step S307 and S309 in the flowchart of FIG. 3, to generate output bits, the number of which corresponds with that of the corresponding bits detected by the corresponding bit detection unit 909.

The reserved bit processing unit 908 supplies the reserved bit stream at step S308 or S310 to the output selection unit 904 in accordance with a control signal from the control unit 902.

The output selection unit 904 selects one of the bit streams supplied from the termination processing unit 903, the output bit generation unit 907 and the reserved bit processing unit 908 in accordance with a control signal from the control unit 902, and outputs the selected bit stream.

Note that the control unit 902 performs processing corresponding to the determination branching steps S300 and S306 in the flowchart of FIG. 3, and issues the control signals for the respective blocks.

As described above, according to the second embodiment, in comparison with the conventional method, the loop processing in the arithmetic coding is reduced and the increment of the number of reserved bits can be suppressed. As a result, an arithmetic coding apparatus capable of performing processing with a smaller circuit scale and reduced power consumption can be provided.

Further, it may be arranged such that an input device (an image sensing device such as a video camera or an image scanner, or a storage device for storing uncompressed image data) to input image data to be encoded is provided, and the other respective constituent elements shown in FIG. 7 are realized with a high-level control unit such as a microcomputer and a RAM holding a program executed by the control unit. Further, it may be arranged such that only the arithmetic coding unit 107 in FIG. 7 is realized with a microcomputer and a software program executed by the microcomputer.

Further, in the first and second embodiments, the present invention is applied to an image sensing apparatus (video camera) or a video recording and reproducing apparatus. However, as the present invention is applicable to any apparatus having a structure to generate binary symbols as information to be encoded, the present invention is not limited to the above embodiments.

Further, generally, software, i.e., a computer program is stored in a computer-readable storage medium such as a CD-ROM. Then the computer-readable storage medium may be set in a reader of a computer (e.g., a CD-ROM drive) and the computer program may be duplicated or installed in the system, thereby allowing the computer to performs the task of the computer program. Accordingly, the such computer-readable storage medium is included in the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-298214, filed Nov. 1, 2006, which is hereby incorporated by reference herein in its entirety.

The invention claimed is:

1. A coding apparatus, using arithmetic coding, which generates binary data indicating a value of decimal place in a range greater than or equal to "0" and less than "1" as coded data, and outputs the coded data, comprising:
    an image data input unit to input image data;
    a frequency conversion unit to perform frequency conversion on the inputted image data;
    a quantization unit to quantize coefficient data which is frequency-converted by said frequency conversion unit;

a binarization unit to binarize the coefficient data quantized by said quantization unit and output a binary symbol;

a range dividing and selection unit to, upon each input of the binary symbol, repeat dividing of a range represented with finite precision into two ranges in accordance with a ratio between occurrence probabilities of MPS (More Probable Symbol) and LPS (Less Probable Symbol) and selection of one of the two ranges;

a normalization unit to, when a length of the range selected by said range dividing and selection unit is less than a predetermined range length, perform normalization so as to increase the size of said selected range;

a detection unit to detect an upper limit and a lower limit of the range to be normalized; and a reserved bit processing unit to, in a case that a value of the lower limit of the range to be normalized is less than a predetermined criterion and a value of the upper limit of the range to be normalized is not less than the predetermined criterion, determine that a value of digit of interest is unknown at this time, and, if it is determined that the value of the digit of interest is unknown at this time, increment a value of reserved bits.

2. The coding apparatus according to claim 1, wherein said reserved bit processing unit includes:

a determination unit to determine whether or not a threshold value for determination of a decimal place of interest exists within a range of interest to be normalized;

a reserved bit incrementation unit to, when said determination unit determines that said threshold value exists within said range of interest, increment the number of reserved bits by one; and a code bit output unit to, when said determination unit determines that said threshold value exists within said range of interest, output 1-bit data determined based on a relative position between said range of interest and said threshold value, determine bit number data corresponding to the number of reserved bits and output the bit number data, and clear the number of reserved bits to zero.

3. A non-transitory computer-readable recording medium, read and executed by a computer, thereby causes the computer to perform functions of the respective units in claim 1.

4. A control method for a coding apparatus, using arithmetic coding, which generates binary data indicating a value of decimal place greater than or equal to "0" and less than "1" as coded data, and outputs the coded data, comprising:

an image data input step of inputting image data;

a frequency conversion step of performing frequency conversion on the input image data;

a quantization step of quantizing coefficient data which is frequency-converted in said frequency conversion step;

a binarization step of binarizing the coefficient data quantized in said quantization step and outputting a binary symbol;

a range dividing and selection step of, upon each input of the binary symbol, repeating dividing of a range represented with finite precision into two ranges in accordance with a ratio between occurrence probabilities of MPS (More Probable Symbol) and LPS (Less Probable Symbol) and selection of one of the two ranges;

a normalization step of, when a length of the range selected by said range dividing and selection step is less than a predetermined range length, performing normalization so as to increase the size of said selected range;

a detection step of detecting an upper limit and a lower limit of the range to be normalized; and a reserved bit processing step of, in a case that a value of the lower limit of the range to be normalized is less than a predetermined criterion and a value of the upper limit of the range to be normalized is not less than the predetermined criterion, determining that a value of digit of interest is unknown at this time, and, if it is determined that the value of the digit of interest is unknown at this time, incrementing a value of reserved bits.

5. The control method according to claim 4, wherein said reserved bit processing step includes:

a determination step of determining whether or not a threshold value for determination of a decimal place of interest exists within a range of interest to be normalized;

a reserved bit incrementation step of, when it is determined at said determination step that said threshold value exists within said range of interest, incrementing the number of reserved bits by one; and a code bit output step of, when it is determined at said determination step that said threshold value exists within said range of interest, outputting 1-bit data determined based on a relative position between said range of interest and said threshold value, determining bit number data corresponding to the number of reserved bits and outputting the bit number data, and clearing the number of reserved bits to zero.

6. A coding apparatus, using arithmetic coding, which generates binary data indicating a value of decimal place in a range greater than or equal to "0" and less than "1" as coded data, and outputs the coded data, comprising:

an image data input unit to input image data;

a frequency conversion unit to perform frequency conversion on the inputted image data;

a quantization unit to quantize coefficient data which is frequency-converted by said frequency conversion unit;

a binarization unit to binarize the coefficient data quantized by said quantization unit and output a binary symbol;

a range dividing and selection unit to, upon each input of the binary symbol, repeat dividing of a range represented with finite precision into two ranges in accordance with a ratio between occurrence probabilities of MPS (More Probable Symbol) and LPS (Less Probable Symbol) and selection of one of the two ranges;

a normalization unit to, when a length of the range selected by said range dividing and selection unit is less than a predetermined range length, perform normalization so as to increase the size of said selected range;

a detection unit to detect an upper limit and a lower limit of the range to be normalized; and a reserved bit processing unit to, based on relationships between a predetermined criterion and each of values of the upper limit and the lower limit of the range to be normalized, determine whether a value of reserved bits is incremented, wherein the reserved bits represent that a value of digit of interest is unknown at this time.

7. A non-transitory computer-readable recording medium, read and executed by a computer, thereby causes the computer to perform functions of the respective units in claim 6.

8. A control method for a coding apparatus, using arithmetic coding, which generates binary data indicating a value of decimal place greater than or equal to "0" and less than "1" as coded data, and outputs the coded data, comprising:

an image data input step of inputting image data;

a frequency conversion step of performing frequency conversion on the input image data;

a quantization step of quantizing coefficient data which is frequency-converted in said frequency conversion step;

a binarization step of binarizing the coefficient data quantized in said quantization step and outputting a binary symbol;

a range dividing and selection step of, upon each input of the binary symbol, repeating dividing of a range represented with finite precision into two ranges in accordance with a ratio between occurrence probabilities of MPS (More Probable Symbol) and LPS (Less Probable Symbol) and selection of one of the two ranges;

a normalization step of, when a length of the range selected by said range dividing and selection step is less than a predetermined range length, performing normalization so as to increase the size of said selected range;

a detection step of detecting an upper limit and a lower limit of the range to be normalized; and a reserved bit processing step of, based on relationships between a predetermined criterion and each of values of the upper limit and the lower limit of the range to be normalized, determining whether a value of reserved bits is incremented, wherein the reserved bits represent that a value of digit of interest is unknown at this time.

* * * * *